United States Patent [19]
Satou et al.

[11] Patent Number: 5,982,468
[45] Date of Patent: *Nov. 9, 1999

[54] LIQUID CRYSTAL DISPLAY APPARATUS HAVING DUMMY LEAD AND DUMMY LAND FOR ALIGNMENT

[75] Inventors: Akihide Satou; Takanobu Kai, both of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/821,929

[22] Filed: Mar. 21, 1997

[30] Foreign Application Priority Data

Mar. 21, 1996 [JP] Japan ...................................... 8-064971

[51] Int. Cl.$^6$ .............................. G02F 1/1345; H05K 1/11
[52] U.S. Cl. ........................... 349/150; 349/151; 349/152; 361/792
[58] Field of Search .................................... 349/150, 151, 349/152; 361/792

[56] References Cited

U.S. PATENT DOCUMENTS

| | | | |
|---|---|---|---|
| 4,357,061 | 11/1982 | Crosby | 349/60 |
| 4,721,365 | 1/1988 | Nishimura | 349/152 |
| 5,358,412 | 10/1994 | Maurinus et al. | 349/60 |
| 5,404,239 | 4/1995 | Hirai | 349/150 |
| 5,572,346 | 11/1996 | Sakamoto et al. | 349/150 |
| 5,670,994 | 9/1997 | Kawaguchi et al. | 349/150 |
| 5,767,571 | 6/1998 | Kimura et al. | 257/668 |
| 5,768,107 | 6/1998 | Ouchi et al. | 361/792 |

FOREIGN PATENT DOCUMENTS

| | | |
|---|---|---|
| 3-289628 | 12/1991 | Japan . |
| 5-21515 | 1/1993 | Japan . |
| 5-346562 | 12/1993 | Japan . |
| 6-51331 | 2/1994 | Japan . |

*Primary Examiner*—William L. Sikes
*Assistant Examiner*—Toan Ton
*Attorney, Agent, or Firm*—Sughrue, Mion, Zinn, Macpeak & Seas, PLLC

[57] ABSTRACT

In a liquid crystal display (LCD) apparatus, at least one flexible printed board for driving an LCD panel has input terminals and a dummy lead as an alignment marker. An opening is perforated at an end of the flexible printed board. A printed wiring board has connection pads to be connected to the input terminals and a dummy land as an alignment marker.

12 Claims, 12 Drawing Sheets

LIQUID CRYSTAL DISPLAY APPARATUS HAVING DUMMY LEAD AND DUMMY LAND FOR ALIGNMENT

BACKGROUND OF THE INVENTION

1. Field of the Invention

The present invention relates to a liquid crystal display (LCD) apparatus, and more particularly, to the alignment of a flexible printed board with a printed wiring board.

2. Description of the Related Art

Generally, an LCD apparatus is constructed by an LCD panel, at least one flexible printed board and a printed wiring board. The flexible printed board drives the LCD panel and has leads or input terminals. The printed wiring board has leads or connection pads to be connected the input terminals of the flexible printed board.

In a first prior art LCD apparatus, alignment holes are perforated in the flexible printed board, and alignment holes are perforated in the printed board. When the flexible printed board is mounted on the printed wiring board, the alignment holes of the flexible printed board are in alignment with the corresponding alignment holes of the printed wiring board, i.e., one of the alignment holes of the flexible printed board is superposed onto one of the alignment holes of the printed wiring board. In this case, the alignment holes are used only for alignment, not for reinforcing the mounting of the flexible printed board on the printed wiring board. This will be explained later in detail.

In the first prior art LCD apparatus however, since the alignment holes of the flexible printed board are perforated independent of the leads thereof, and the alignment holes of the printed wiring board are perforated independent of the leads thereof, a relative displacement error of the alignment holes of the flexible printed board and a relative displacement error of the alignment holes of the printed wiring board are superposed onto each other to create a large error of alignment.

In addition, after the flexible printed board is mounted on the printed wiring board, bending stress is applied to the leads of the flexible printed board, so that disconnections and cracks are generated in these leads.

In a second prior art LCD apparatus (see: JP-A-5-21515), an LCD panel is mounted on a glass substrate. Also, input terminals or electrodes are formed on the glass substrate and are electrically connected to the LCD panel. Also, dummy electrodes for alignment are formed on both sides of the series of electrodes. The width of some of the dummy electrodes is half of that of the electrodes, and the width of the other dummy electrodes is twice of that of the electrodes. This will also be explained later in detail.

In the second prior art LCD apparatus, an alignment along one direction is precisely carried out; however, an alignment along the other direction is impossible.

In a third prior art LCD apparatus (see: JP-A-5-346562), T-shaped alignment marks are formed on a first transparent substrate, and reversed-T-shaped alignment marks are formed on a second transparent substrate. In this case, the spacing between the alignment marks deviates stepwise at a prescribed size, so that the two kinds of alignment marks form slide calipers. Therefore, the first transparent substrate can be precisely in alignment with the second transparent substrate. This will also be explained later in detail.

In the third prior art LCD apparatus, however, the number of alignment marks required to form the slide calipers is large, so that a large space therefor is required. Thus, the alignment system of the third prior art LCD apparatus cannot be applied to the alignment of a flexible printed board to a printed wiring board.

In a fourth prior art LCD apparatus (see: JP-A-6-51331) fixed patterns are provided on both sides of the flexible printed board, and fixed pads are provided on the printed wiring board to correspond to the fixed patterns. The fixed patterns are soldered to the fixed pads, thus reinforcing the coupling of the flexible printed board to the printed wiring board. This will also be explained later in detail.

In the fourth prior art LCD apparatus, however, the fixed patterns and the fixed pads do not serve as alignment markers, and therefore, such alignment markers need to be provided which increases the occupied space of the flexible printed boards and the spacing therebetween.

In a fifth prior art LCD apparatus (see: JP-A-3-289628), flexible printed boards are in alignment with a printed wiring board by penetrating spacer elements therethrough, which are made of plastic or like. Then, the upper and lower portions of the spacer elements are caulked so that the flexible printed board are fixed to the printed wiring board. This will also be explained later in detail.

In the fifth prior art LCD apparatus, however, the operations for penetrating and fixing the spacer elements require time, thus increasing the manufacturing cost.

SUMMARY OF THE INVENTION

It is an object of the present invention to provide an LCD apparatus capable of a precise alignment of a flexible printed board with a printed wiring board without increasing the manufacturing cost.

Another object is to easily reinforce the coupling of the flexible printed board to the printed wiring board.

A further object is to provide a method for manufacturing the above-mentioned LCD apparatus.

According to the present invention, in an LCD apparatus, at least one flexible printed board for driving an LCD panel has input terminals and a dummy lead as an alignment marker. An opening is perforated at an end of the flexible printed board. A printed wiring board has connection pads to be connected to the input terminals and a dummy land as an alignment marker.

Thus, an alignment of the flexible printed board with the printed wiring board can be achieved by superposing the dummy lead onto the dummy land.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, prior art LCD apparatuses will be explained with reference to FIGS. 1A, 1B, 2A, 2B, 3, 4, 5, 6A and 6B.

Figure 1A:
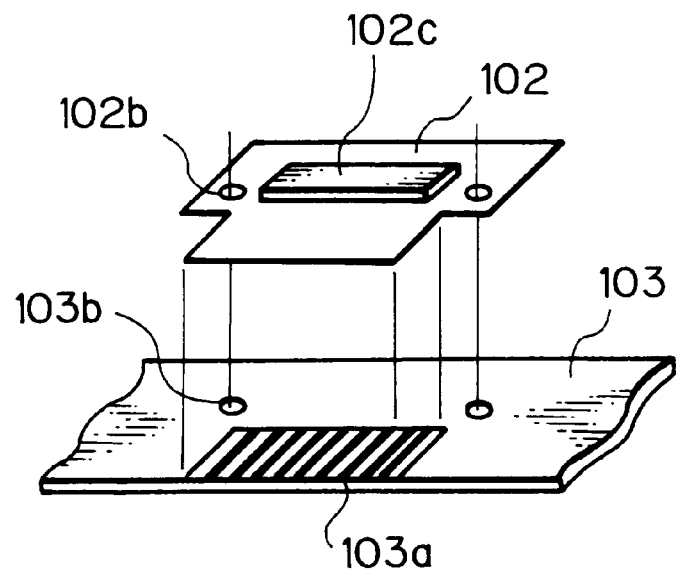
FIG. 1A is an exploded, perspective view illustrating a first prior art LCD apparatus.
Figure 1B:
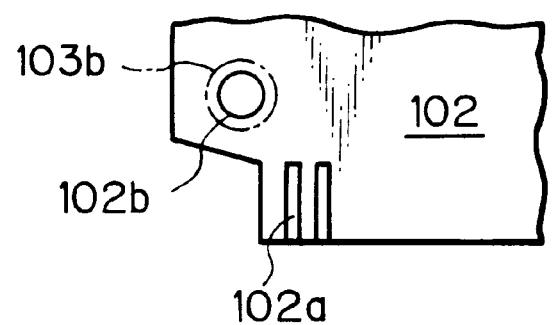
FIG. 1B is a partly enlarged plan view of the flexible printed board of FIG. 1A.
Figure 2A:
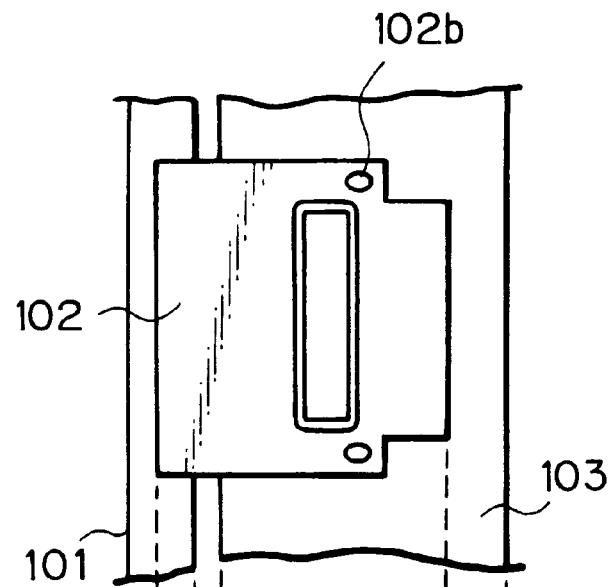
FIG. 2A is a plan view of the apparatus of FIG. 1A.
Figure 2B:
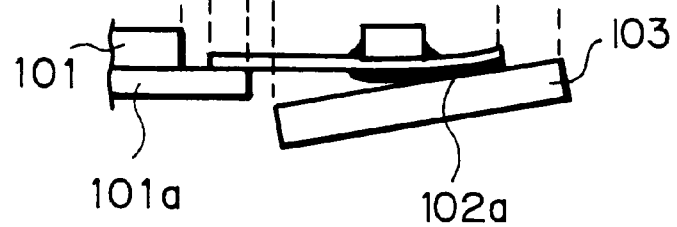
FIG. 2B is a side view of the apparatus of FIG. 2A.

FIG. 1A is an exploded, perspective view illustrating a first prior art LCD apparatus, and FIG. 1B is a partly enlarged plan view of the apparatus of FIG. 1A. In FIGS. 1A and 1B, reference numeral 102 designates a flexible printed board on which leads 102a are printed. Also, reference numeral 103 designates a printed wiring board on which leads 103a are printed. Note that the flexible printed board 102 is coupled to an LCD panel 101 mounted on a glass substrate 101a. The LCD panel 101 and the glass substrate 101a are not shown in FIGS. 1A and 1B, but are shown in FIGS. 2A and 2B.

Also, alignment holes 102b are perforated in the flexible printed board 102, and alignment holes 103b are perforated in the printed board 103. When the flexible printed board 102 is mounted on the printed wiring board 103, the alignment holes 102b are in alignment with the corresponding alignment holes 103b, i.e., one of the alignment holes 102b is superposed onto one of the alignment holes 103b, as illustrated in FIG. 1B.

Note that the alignment holes 102b and 103b are used only for alignment, not for reinforcing the mounting of the flexible printed board 102 on the printed wiring board 103.

Further, a driving integrated circuit (IC) device 102c for driving an LCD panel (not shown) is mounted on the flexible printed board 102.

In the first prior art LCD apparatus as illustrated in FIGS. 1A and 1B, however, since the alignment holes 102b are perforated independent of the leads 102a and the alignment holes 103b are perforated independent of the leads 103a, a relative displacement error of the alignment holes 102b with respect to the leads 102a and a relative displacement error of the alignment holes 103b with respect to the leads 103a are superposed onto each other to create a large error of alignment.

In addition, as illustrated in FIGS. 2A and 2B, after the flexible printed board 102 is mounted on the printed wiring board 103, bending stress is applied to the leads 102a, so that disconnections and cracks are generated in the leads 102a.

Figure 3:
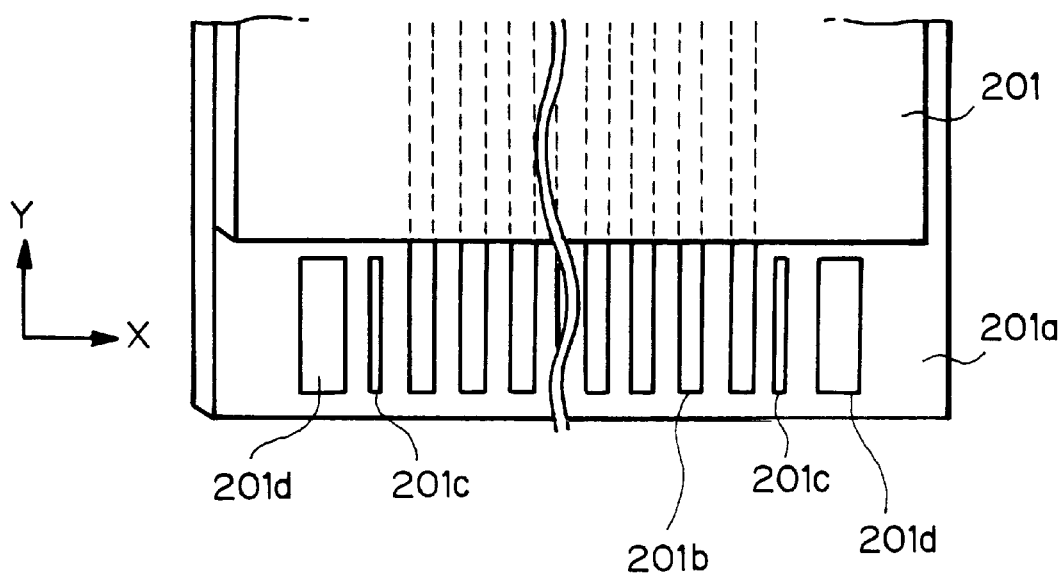
FIG. 3 is a plan view illustrating a second prior art LCD apparatus.

In FIG. 3, which illustrates a second prior art LCD apparatus (see: JP-A-5-21515), reference numeral 201 designates an LCD panel mounted on a glass substrate 201a. Electrodes 201b are formed on the glass substrate 201a and are electrically connected to the LCD panel 201. Also, dummy electrodes 201c and 201d are formed on both sides of the series of the electrodes 201b. The width of the dummy electrodes 201c is half of that of the electrodes 201b, and the width of the dummy electrodes 201d is twice of that of the electrodes 201b. The dummy electrodes 201c and 201d serve as alignment markers for flexible printed boards (not shown).

In the second prior art LCD apparatus as illustrated in FIG. 3, an alignment along an X direction is precisely carried out; however, an alignment along a Y direction is impossible.

Figure 4:
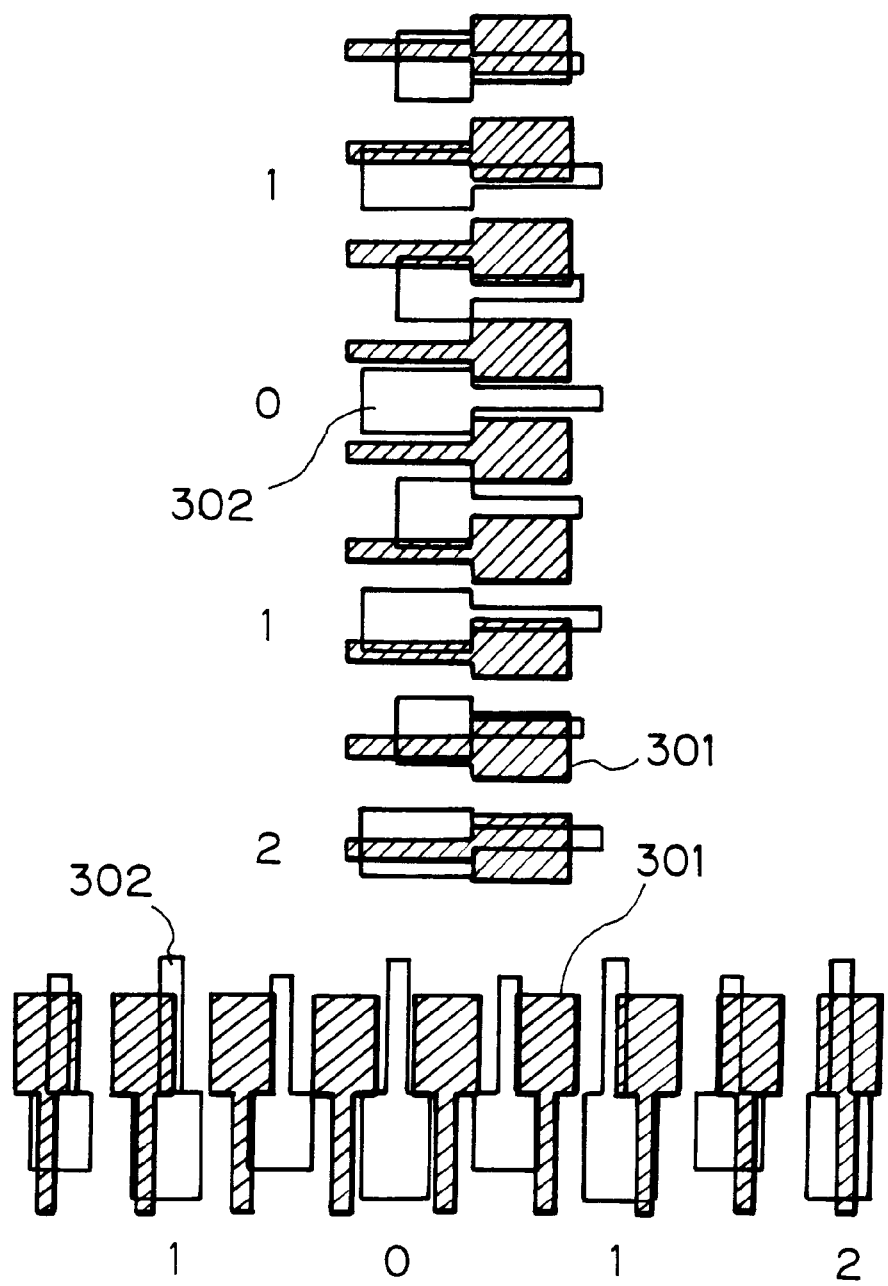
FIG. 4 is a plan view illustrating a third prior art LCD apparatus.

In FIG. 4, which illustrates a third prior art LCD apparatus (see: JP-A-5-346562), T-shaped alignment marks 301 are formed on a first transparent substrate (not shown), and reversed-T-shaped alignment marks 302 are formed on a second transparent substrate (not shown). The spacing between the alignment marks 301 and 302 deviates stepwise at a prescribed size, so that the alignment marks 301 and 302 form slide calipers. Therefore, the first transparent substrate can be precisely in alignment with the second transparent substrate.

In the third prior art LCD apparatus as illustrated in FIG. 4, however, the number of alignment marks required to form the slide calipers is large, so that a large space therefor is required. Thus, the alignment system of the third prior art LCD apparatus cannot be applied to the alignment of the flexible printed board to the printed wiring board.

Figure 5:
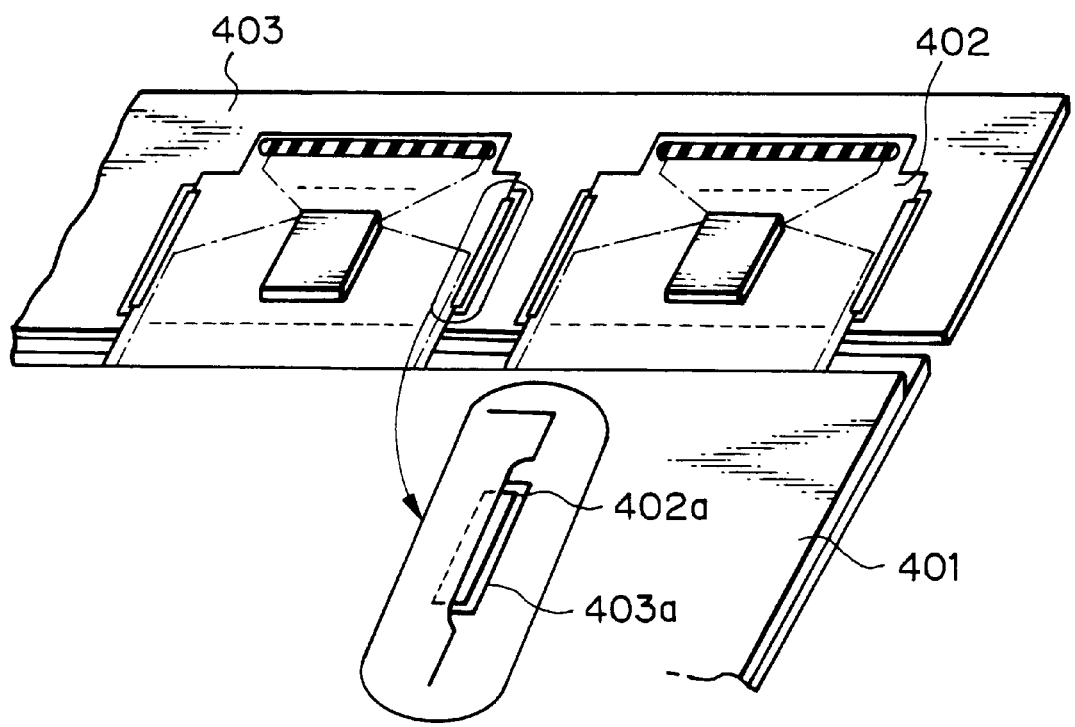
FIG. 5 is a perspective view illustrating a fourth prior art LCD apparatus.

In FIG. 5, which illustrates a fourth prior art LCD apparatus (see: JP-A-6-51331), reference numeral 401 designates an LCD panel, 402 designates a flexible printed board, and 403 designates a printed wiring board. Fixed patterns 402a are provided on both sides of the flexible printed board 402, and fixed pads 403a are provided on the printed wiring board 403 to correspond to the fixed patterns 402a. The fixed patterns 402a are soldered to the fixed pads 403a, thus reinforcing the coupling of the flexible printed board 402 to the printed wining board 403.

In the fourth prior art LCD apparatus as illustrated in FIG. 5, however, the fixed patterns 402a and the fixed pads 403a do not serve as alignment markers, and therefore, such alignment markers need to be provided which increases the occupied space of the flexible printed boards 402 and the spacing therebetween.

Figure 6A:
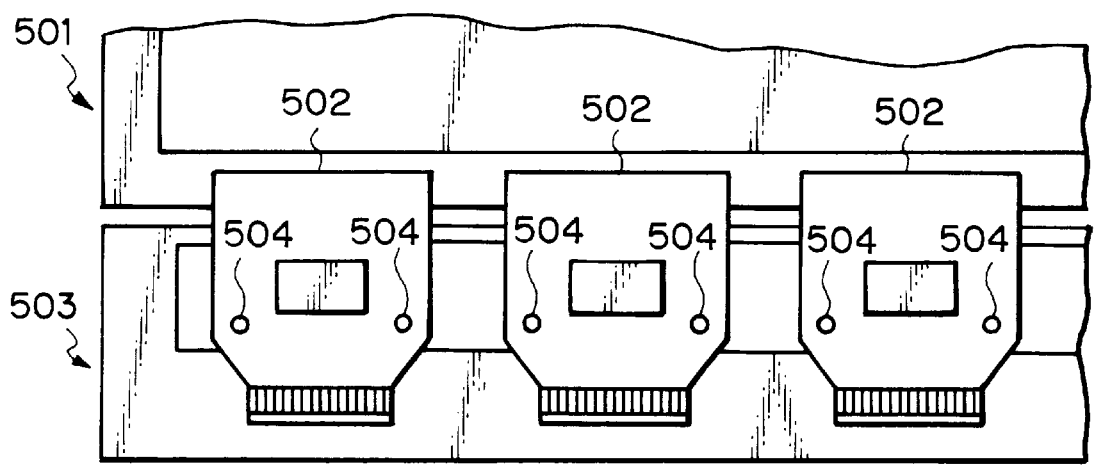
FIG. 6A is a plan view illustrating a fifth prior art LCD apparatus.
Figure 6B:
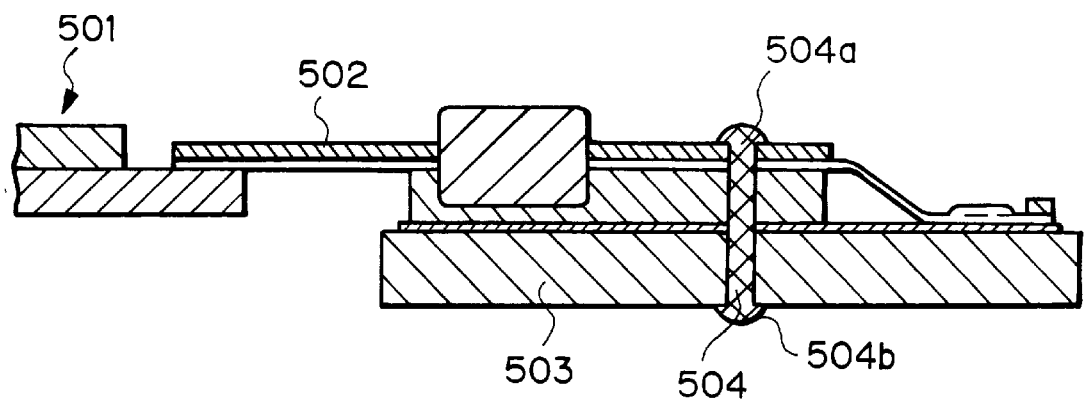
FIG. 6B is a cross-sectional view of the apparatus of FIG. 6A.

FIG. 6A illustrates a fifth prior art LCD apparatus, and FIG. 6B is a cross-sectional view of the apparatus of FIG. 6A (see: JP-A-3-289628). In FIGS. 6A and 6B, reference numeral 501 designates an LCD panel, 502 designates flexible printed boards, and 503 designates a printed wiring board. The flexible printed boards 502 are in alignment with the printed wiring board 503 by penetrating spacer elements 504 therethrough. Then, the upper portions 504a and the lower portions 504b of the spacer elements 504 are caulked so that the flexible printed boards 502 are fixed to the printed wiring board 503. In this case, the spacer elements 504 are made of plastic or the like.

In the fifth prior art LCD apparatus as illustrated in FIGS. 6A and 6B, however, the operations for penetrating and fixing the spacer elements 504 require time, thus increasing the manufacturing cost.

Figure 7A:
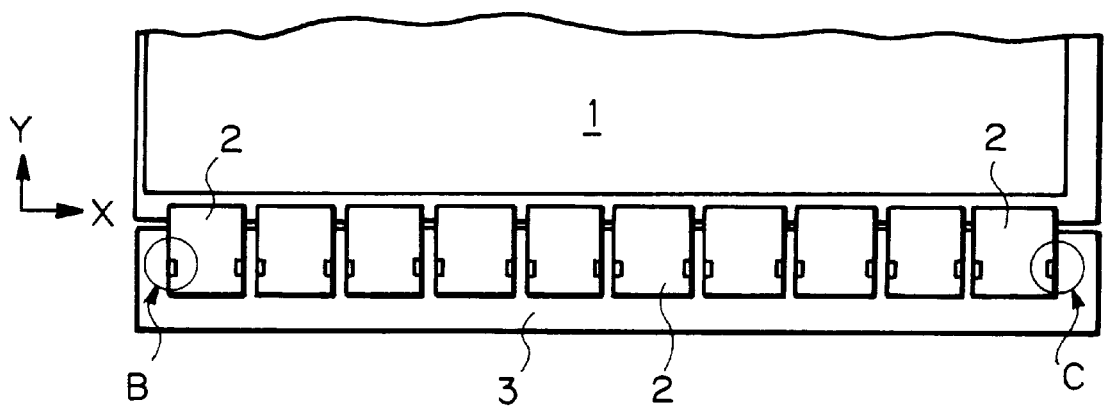
FIG. 7A is a plan view illustrating an embodiment of the LCD apparatus according to the present invention.
Figure 7B:
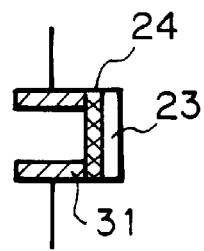
FIG. 7B and 7C are enlarged views of the parts B and C of the apparatus of FIG. 7A.
Figure 7C:
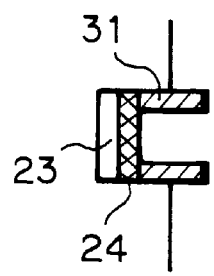
Figure 8A:
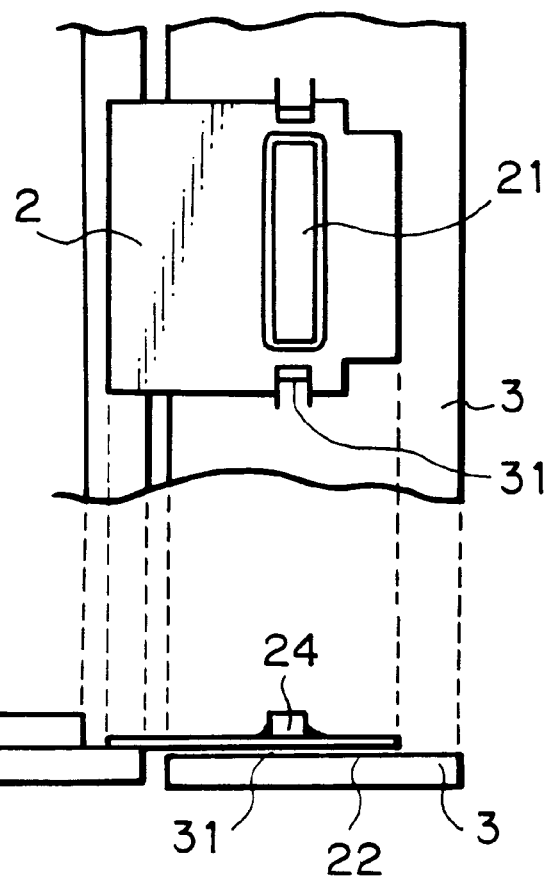
FIG. 8A is a partly enlarged plan view of the apparatus of FIG. 7A.
Figure 8B:
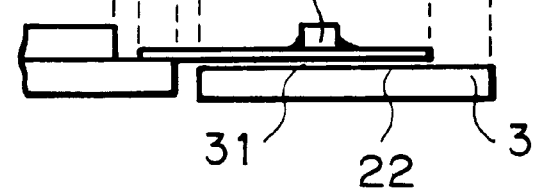
FIG. 8B is a side view of the apparatus of FIG. 8A.
Figure 8C:
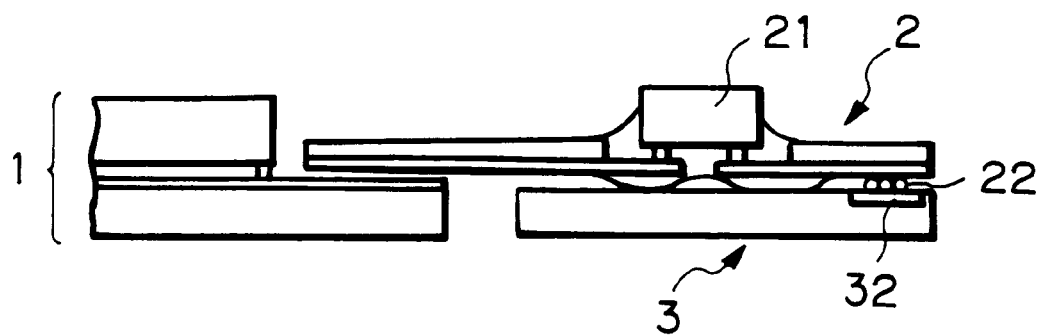
FIG. 8C is an enlarged view of FIG. 8B.

FIG. 7A is a plan view illustrating an embodiment of the present invention, and FIGS. 7B and 7C are enlarged views of the parts B and C of the apparatus of FIG. 7A. Also, FIG. 8A is a partly-enlarged view of the apparatus of FIG. 7A, FIG. 8B is a side view of the apparatus of FIG. 8A, and FIG. 8C, is an enlargement of FIG. 8B.

In FIGS. 7A, 7B, 7C, 8A, 8B and 8C, reference numeral 1 designates a LCD panel into which liquid crystal is introduced. A row of flexible printed boards 2 are connected to the LCD panel 1. Each of the flexible printed board 2 has one driving IC device 21 for driving the LCD panel 1. Also, a printed wiring board 3 supplies signals and voltages to input terminals 22 of the flexible printed board 2.

In both sides of each of the flexible printed boards 2, rectangular openings 23 are perforated. The up and down edges of the rectangular openings 23 are perpendicular to the row of the flexible printed boards 2. Also, dummy leads 24 are formed on the flexible printed boards 2 to cross the openings 23. The dummy leads 24 serve as alignment markers of the flexible printed boards 2.

The dummy leads 24 are formed simultaneously with the formation of circuit patterns (not shown) including the input terminals 22 on the flexible printed boards 2. Therefore, no relative error of the position of the dummy leads 24 to that of the input terminals 22 is generated. Also, in this case, the dummy leads 24 are parallel to the direction of the input terminals 22.

Figure 9A:
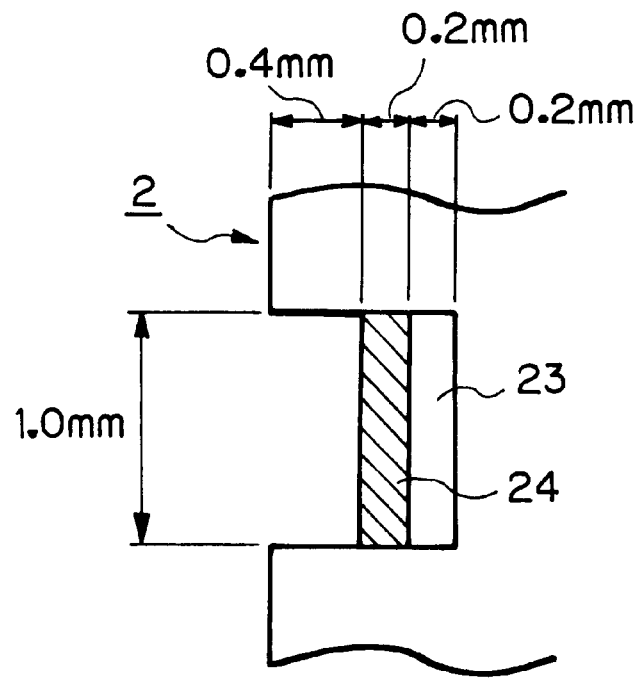
FIG. 9A is a diagram showing the size of the opening and the dummy lead of FIG. 7B.

An example of the size of one of the openings 23 and the size of one of the dummy leads 24 is shown in FIG. 9A.

On the other hand, U-shaped dummy lands 31 are formed on the printed wiring board 3. The dummy lands 31 serve as alignment markers of the printed wiring board 3.

The dummy lands 31 are formed simultaneously with the formation of circuit patterns (not shown) including connection pads 32. Therefore, no relative error of the position of the dummy lands 31 to that of the connection pads 15 is generated.

Figure 9B:
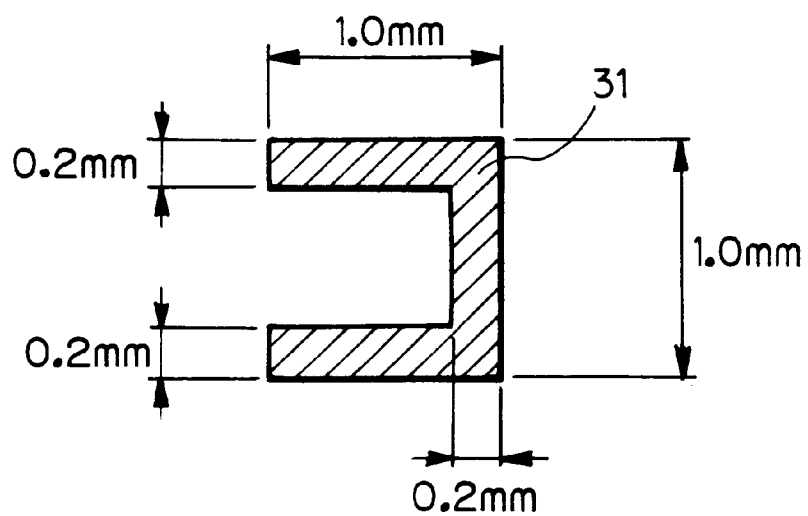
FIG. 9B is a diagram showing the size of the dummy land of FIG. 7C.

An example of one of the dummy lands 31 is shown in FIG. 9B.

The number of the dummy lands 31 on the printed wiring board 3 is at least two. This is because the alignment pitch of the flexible printed boards 2 to the LCD panel 1 is less than about 100 $\mu$m, while the alignment pitch of the flexible printed boards 2 to the printed wiring board 3 is about 300 $\mu$m. Therefore, if only two of the flexible printed boards 2 are in good alignment with the printed wiring board 3, all the flexible printed boards 2 are in good alignment with the printed wiring board 3.

The method for assembling the LCD apparatus of FIG. 7A is explained next with reference to FIGS. 10A, 10B and 11. Note that FIG. 10A is an exploded, perspective view of the LCD apparatus of FIG. 7A and FIG. 10B is a partial plan view of the apparatus of FIG. 7A.

Figure 10A:
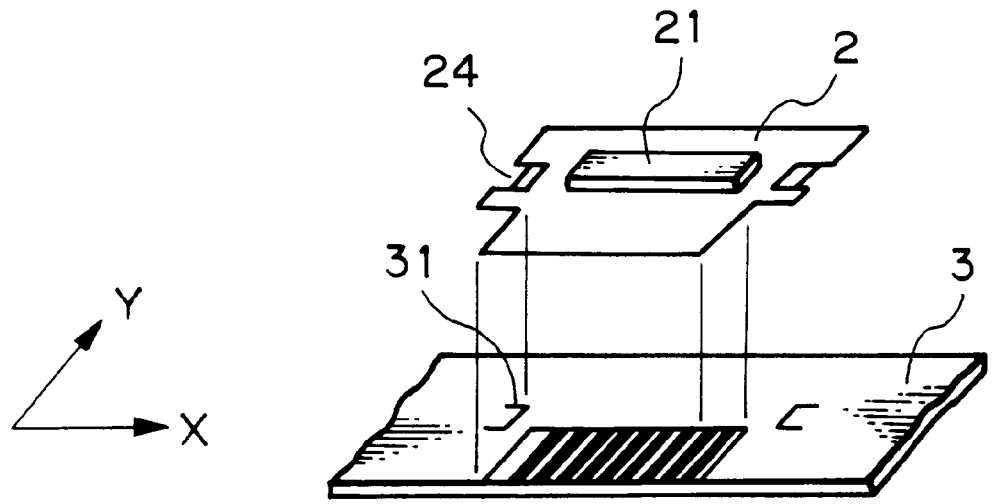
FIG. 10A is a perspective view for explaining a first assembling step of the apparatus of FIG. 7A.
Figure 10B:
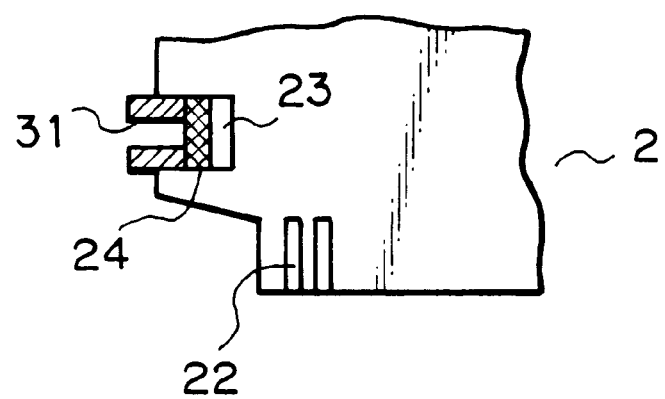
FIG. 10B is a plan view of the apparatus of FIG. 10A.

First, referring to FIGS. 10A and 10B, an alignment operation along an X direction, i.e., along the row of the flexible printed boards 2 is carried out. That is, the dummy leads 24 are superposed onto the body portions of the corresponding dummy lands 31. In this case, since the size of each of the dummy leads 24 is the same as that of each of the body portions of the dummy lands 31, it is easy to detect a deviation therebetween. Thus, this alignment operation can be easily carried out.

Figure 11:
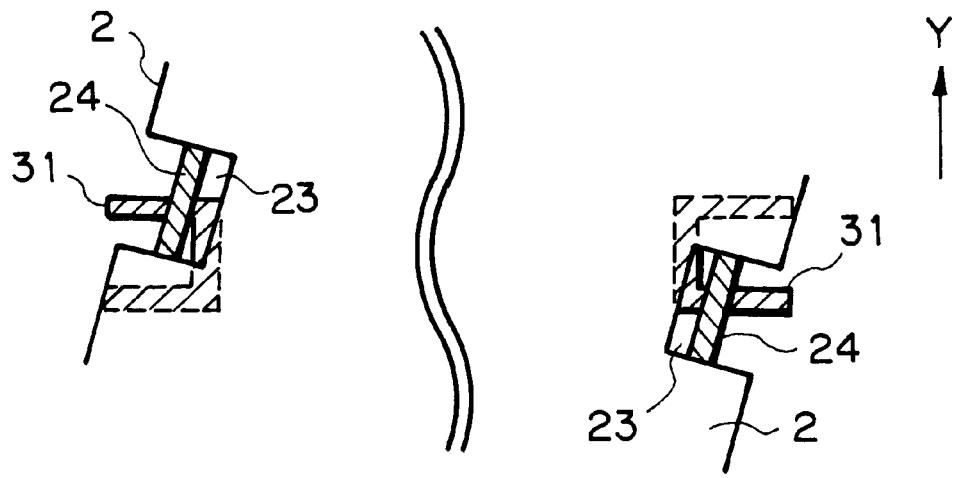
FIG. 11 is a plan view for explaining a second assembling step of the apparatus of FIG. 7A.

Next, referring to FIG. 11, an alignment operation along a Y direction is carried out. That is, the alignment operation is carried out along a direction perpendicular to the row of the flexible printed boards 2. In this operation the leg portions of each of the dummy lands 24 is put within the corresponding openings 23. In this case, since the distance between the legs of each of the dummy lands 31 is the same as the width of each of the openings 23, it is easy to detect a deviation therebetween. Thus, this alignment operation can also be easily carried out.

Note that the above-mentioned two alignment operations can be carried out by using an automatic alignment apparatus. Also, if the two alignment operations are perfect, an alignment operation along an angle direction is unnecessary.

Finally, a soldering operation is performed upon coupling portions between the dummy leads 24 and the body portions of the dummy lands 31, thus reinforcing the coupling portions. As a result, stress applied to the input terminals 22 and the connection pads 32 are released, so that cracks or disconnections of the leads can be avoided.

Figure 12A:
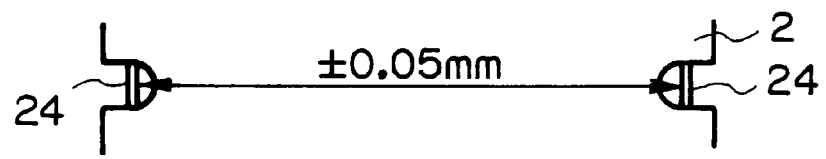
FIGS. 12A and 12B are plan views showing the effect of the present invention.
Figure 12B:
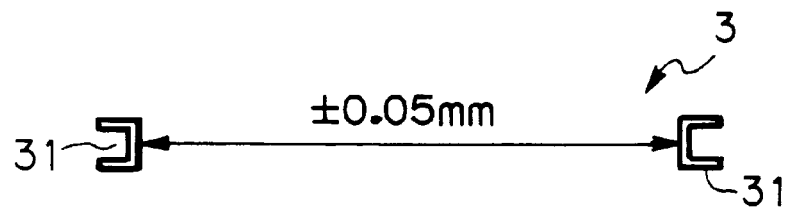
Figure 13A:
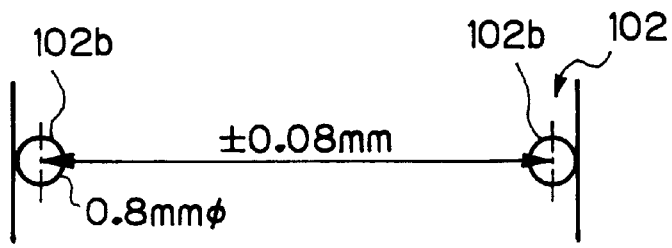
FIGS. 13A and 13B are plan views showing the effect of the prior art.
Figure 13B:
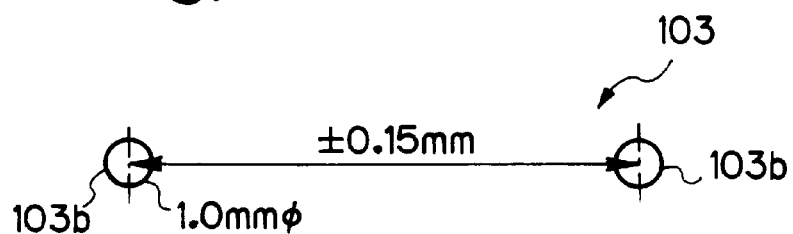

According to the embodiment, for example, the accuracy of a pattern between the dummy leads 24 is ±0.05 mm as shown in FIG. 12A and the accuracy of a pattern between the dummy lands 31 is ±0.05 mm as shown in FIG. 12B, therefore, since an alignment accuracy is 0 due to the same width of these patterns, a total tolerance is ±0.10 mm. Contrary to this, in the first prior art apparatus, for example, the accuracy of a pattern between the alignment holes 102$b$ is ±0.08 mm as shown in FIG. 13A and the accuracy of a pattern between the alignment holes 103$b$ is ±0.15 mm as shown in FIG. 13B. Therefore. if an alignment accuracy is ±0.1 mm due to the disparity of these holes, a total tolerance is ±0.33 mm. Thus, the total tolerance can be improved about three times.

Figure 14:
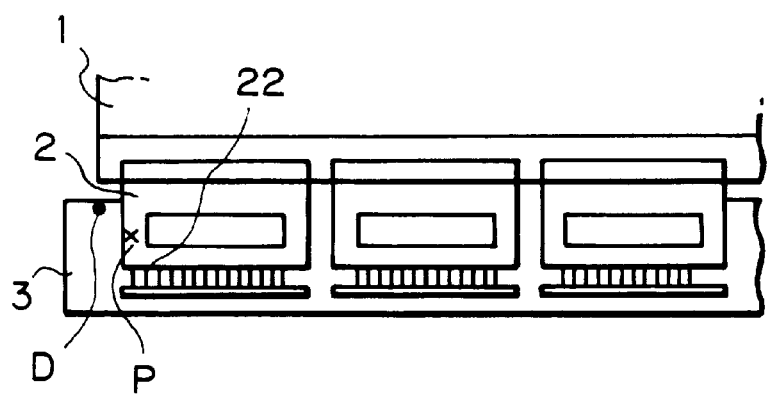
FIG. 14 is a plan view for explaining an experiment relating to the reinforcement of an LCD apparatus.

Also, according to the inventor's experiment, after the reinforcement of the flexible printed board 2 to the printed wiring board 3 is carried out by solding as indicated by P in FIG. 14, when a stress of about 600 g is applied to a portion of the printed wiring board 3 as indicated by Q in FIG. 14, the input terminals 22 are broken or disconnected. Contrary to this, if the above-reinforcement is not carried out, when a stress of about 400 g is applied to the portion of the printed wiring board 3 as indicated by Q in FIG. 14, the input terminals 22 are broken or disconnected. Thus, the effect of the above-mentioned reinforcement by soldering is remarkably exhibited.

As explained hereinabove, according to the present invention, a precise alignment of a flexible printed board with a printed wiring board can be carried out without increasing the manufacturing cost. In addition, the coupling of the flexible printed board to the printed wiring board can be reinforced.

We claim:

1. A liquid crystal display (LCD) apparatus comprising:
   an LCD panel;
   at least one flexible printed board mounting a device for driving said LCD panel and having a dummy lead crossing an opening provided at an end of said flexible printed board; and
   a printed wiring board having a dummy land corresponding to said dummy lead.

2. The apparatus as set forth in claim 1, wherein said dummy lead is parallel to input terminals of said flexible printed board.

3. The apparatus as set forth in claim 2, wherein said dummy lead is formed simultaneously with formation of said input terminals.

4. The apparatus as set forth in claim 1, wherein said dummy land is a U-shape which has a body parallel to said dummy lead and two legs corresponding to two edges of said opening.

5. The apparatus as set forth in claim 1, wherein said dummy land is formed simultaneously with formation of connection pads of said printed wiring board.

6. The apparatus as set forth in claim 1, wherein said dummy lead is coupled by solder to said dummy land.

7. A liquid crystal display (LCD) apparatus comprising:

an LCD panel;

at least one flexible printed board mounting a device for driving said LCD panel and having input terminals and a dummy lead as an alignment marker for said input terminals, said dummy lead crossing an opening provided at an end of said flexible printed board; and a printed wiring board having connection pads corresponding to said input terminals and a dummy land as an alignment marker for said connection pads, said dummy land corresponding to said dummy lead.

8. The apparatus as set forth in claim 7, wherein said dummy lead is parallel to said input terminals.

9. The apparatus as set forth in claim 7, wherein said dummy lead is formed simultaneously with formation said input terminals.

10. The apparatus as set forth in claim 7, wherein said dummy land is a U-shape which has a body parallel to said dummy lead and two legs corresponding to two edges of said opening.

11. The apparatus as set forth in claim 7, wherein said dummy land is formed simultaneously with formation of said connection pads.

12. The apparatus as set forth in claim 7, wherein said dummy lead is coupled by solder to said dummy land.

* * * * *